United States Patent
Kawarada et al.

[11] Patent Number: 5,260,106
[45] Date of Patent: Nov. 9, 1993

[54] METHOD FOR FORMING DIAMOND FILMS BY PLASMA JET CVD

[75] Inventors: Motonobu Kawarada, Sagamihara; Kazuaki Kurihara; Ken-ichi Sasaki, both of Atsugi; Akitomo Teshima, Isehara; Nagaaki Koshino, Yokohama, all of Japan

[73] Assignee: Fujitsu Limited, Kawasaki, Japan

[21] Appl. No.: 790,115

[22] Filed: Nov. 12, 1991

Related U.S. Application Data

[63] Continuation of Ser. No. 562,606, Aug. 3, 1990, abandoned.

[51] Int. Cl.$^5$ .................... B05D 3/06; C23C 16/00
[52] U.S. Cl. .................... 427/577; 427/580; 427/249; 427/122; 427/419.7; 427/419.1; 423/446; 428/408; 156/DIG. 68
[58] Field of Search .................... 427/37, 38, 34, 249, 427/419.1, 419.7, 122, 577, 580; 428/408; 443/446; 156/DIG. 68

[56] References Cited

U.S. PATENT DOCUMENTS

| | | | |
|---|---|---|---|
| 4,851,254 | 7/1989 | Yamamoto et al. | 427/37 |
| 4,882,138 | 11/1989 | Pinneo | 423/446 |
| 4,915,977 | 4/1990 | Okamoto et al. | 427/37 |
| 4,919,974 | 4/1990 | McCune et al. | 427/249 |
| 4,988,421 | 1/1991 | Drawl et al. | 204/192.3 |
| 4,989,542 | 2/1991 | Kamo | 118/723 |

FOREIGN PATENT DOCUMENTS

| | | |
|---|---|---|
| 0286306 | 10/1988 | European Pat. Off. |
| 0327110 | 8/1989 | European Pat. Off. |
| 0379994 | 8/1990 | European Pat. Off. |
| 59-93869 | 5/1984 | Japan |
| 63-224226 | 9/1988 | Japan |
| 63-285193 | 11/1988 | Japan |
| 1-139753 | 6/1989 | Japan |
| 1-244707 | 9/1989 | Japan |
| 1-275759 | 11/1989 | Japan |

OTHER PUBLICATIONS

Patent Abstracts of Japan, vol. 14, No. 171 (C-706) [4114], 3rd Apr. 1990; & JP-A-2 22 471 (Fujitsu Ltd) Jan. 25, 1991 *whole document*.
Patent Abstracts of Japan, vol. 13, No. 69 (C-697) [4061], 6th Mar. 1990; & JP-A-1 317 (Kanegafuchi Chem. Ind. Co., Ltd) Dec. 21, 1989 *whole document*.
Patent Abstracts of Japan, vol. 14, No. 397, 28th Aug. 1990; & JP-A-02 149 412 (Namiki Precision Jewel Co., Ltd) Aug. 6, 1990 *whole document*.

Primary Examiner—Roy King
Attorney, Agent, or Firm—Staas & Halsey

[57] ABSTRACT

A diamond film is deposited on a surface of a substrate. The diamond film is attached securely to the substrate by forming a first layer on the surface comprising a mixture of a main component of the substrate and a sintering reinforcement agent for diamond, then forming a second layer comprising a mixture of said agent and diamond on said first layer, and finally forming the diamond film on the second layer.

14 Claims, 10 Drawing Sheets

METHOD FOR FORMING DIAMOND FILMS BY PLASMA JET CVD

This application is a continuation of application Ser. No. 07/562,606, filed Aug. 3, 1990, now abandoned.

BACKGROUND OF THE INVENTION

1. Field of the Invention

The present invention relates to a method and apparatus for vapor deposition of diamond film. More, specifically, it relates to a highly efficient method and apparatus for uniformly vapor depositing a diamond film having superior adhesiveness, superior hardness, and smoothness onto a treated object or substrate and also for depositing a diamond film onto a carburizing material.

2. Description of the Related Art

Diamond is a allotropic form of carbon (C), which exhibits a diamond structure, has a high Mohs hardness of 10, and has a superior thermal conductivity of 1000 or 2000 W/mK, compared with other materials. Therefore, various applications have been developed for using these characteristics.

For example, because of its high hardness, diamond has been considered for use in connection with drill blades or bits. Attempts have been made to cover such tools, which are made of high hardness sintered alloys such as tungsten carbide (WC), with a diamond film. Further, because of its high heat conductivity, diamond has been utilized as a heat sink for LSI, VLSI, laser diode or other semiconductor devices.

When coating a diamond film on a tool made of tungsten carbide (WC) or molybdenum carbide (MoC), even if a chemical vapor deposition apparatus (abbreviated as a "CVD" apparatus) is used similar to that shown in FIG. 1 and the film is grown directly by chemical vapor deposition (abbreviated as "CVD"), the film peels off easily due to differences in the coefficients of heat expansion.

The operation of the above-mentioned known apparatus is as follows.

An object (for example, a tool) to be treated or substrate is placed on a substrate holder 3 cooled by cooling water 2. At the top of the reaction chamber 4 is an anode 6 and a cathode 7 for forming a plasma jet 5. A starting gas 8 is supplied between the anode and the cathode. A DC power source 10 is provided connecting the anode 6 and the cathode 7. At the bottom of the reaction chamber 4 is an exhaust outlet 11. For the CVD growth of diamond, a mixed gas 8 of hydrogen ($H_2$) and a hydrocarbon, for example methane ($CH_4$), is supplied so as to flow between the anode 6 and the cathode 7 and into the interior of the reaction chamber 4. The exhaust system is operated to exhaust chamber 4 through the exhaust outlet 11 and the inside of the reaction chamber 4 is held at a low vacuum, in which state are arc discharge 12 is caused between the anode 6 and the cathode 7, the heat of which causes decomposition and plasmatization of the starting gas 8, whereupon the plasma jet 5 including carbon plasma strikes the metal plate 1 and a diamond film 13 composed of fine crystals is grown on the metal plate 1. Thus, it is possible to grow a diamond film 13 on the treated object 1, but since the coefficients of heat expansion differ (for example, the linear expansion coefficient of diamond is $0.0132 \times 10^{-4} K^{-1}$, while that of W is $0.045 \times 10^{-4} K^{-1}$) and since the temperature is decreased from the high temperature of 800° C. or more at which the CVD reaction is performed to ordinary temperature, the diamond film 13 easily peels off of the treated object 1.

Therefore, in the prior art, when coating a diamond film on a tool made of WC, for example, elements (for example of Co) included in the WC as sintering reinforcements and for causing a reduction of the adhesiveness were chemically removed, and then the CVD method was used to grow the diamond film. Alternatively, mechanical scratches were made in the substrate and the growth was performed over the same. However, since adhesiveness decreases with film thickness, the thickness of the grown film was limited to several μm, and even so the adhesiveness was insufficient for practical use. The present inventors previously proposed, as a method for resolving this problem, the provision of a coating material layer 15 with a coefficient of heat expansion close to diamond on the treated object 1, as shown in FIG. 2, and the growth of a diamond film 13 on the same (Japanese Unexamined Patent Publication (Kokai) No. 1-145313 published Jun. 7, 1989). However, when actually used, the adhesiveness provided was still not satisfactory for tool use.

As mentioned above, diamond has the highest hardness among all materials, so attempts have been made to use it to form drill blades and bits. However, when diamond is coated on a tool made of WC, for example, the coating easily peels off since the heat expansion coefficients differ and therefore this has not been commercialized.

As mentioned earlier, since diamond has a high heat conductivity, it has been considered for use as a heat sink for semiconductor devices and is being commercialized for this. FIG. 2A is a perspective view of a cooling structure, wherein a heat sink 15 comprised of a diamond is brazed by gold on a subcarrier 14 comprised of cooper (Cu). On top of this heat sink 15 is bonded a semiconductor laser or other semiconductor chip 16 by, for example, gold-tin solder.

FIG. 2B shows the sectional structure of the heat sink 15, wherein a titanium (Ti) film 18, platinum (Pt) film 19, and gold (Au) film 20 are formed in successive layers at thicknesses of about 2000 Å respectively. The reason why the Ti film 18 is used is that it forms titanium carbide (TiC) with the diamond film 17 and has a good adhesiveness. Further, the reason why the Pt film 19 is interposed is so as to correct the poor wettabilities of the Ti film 18 and Au film 20. However, such a heat sink 15 suffers considerably from the effects of the heat conductivities of the metal films enclosing it and from the complicated nature of the structure. Further, the bonding of the separate layers requires high temperature, so the semiconductor chip can easily be damaged, or the bonding requires special skills, so the price becomes high.

With reference to the apparatus of FIG. 1, when plate 1 plated on a substrate holder 3 is cooled by cooling water 2, it becomes possible to form a diamond film 13 thereon.

As mentioned above, diamond has an extremely superior heat conductivity of 2000 W/mK, so it is being commercialized as a component material for heat sinks, but as shown in FIG. 2B, a Ti/Pt/Au metal film is formed in layers on the diamond film. Therefore, there are the problems that the heat conductivity of the diamond is impaired and the cost becomes higher.

Furthermore, as mentioned above, diamond is used for high performance tools utilizing its hardness, and is used as heat sinks for devices where there is a large generation of heat such as laser diodes because it has a high heat conductivity which is several times that of copper. However, the surfaces of conventional thick diamond films have been very rough and the use of these films has required polishing of the surface with a diamond disk etc. This polishing work has required considerable time and labor. The density of nucleus production of diamond is $10^7$ to $10^9$ cm$^{-2}$, a density which is much smaller than the density of other materials $10^{13}$), therefore specific crystal particles selectively grow and the surface becomes very rough. In particular, this trend is striking in the case of thick diamond films (a roughness of about 0.2 mm with film thicknesses of 2 mm).

Furthermore, as mentioned above, attempts have been made to cover tools with diamond to utilize its high hardness. As methods for synthesizing diamonds, there are known the high pressure synthesis method and the low pressure synthesis method. The high pressure synthesis method is suitable for forming relatively large sized monocrystals, but the apparatus is cumbersome and the speed of growth is very slow, so there is the problem of a higher cost. As opposed to this, the low pressure synthesis method includes the microwave plasma chemical vapor deposition method and the electron assisted chemical vapor deposition method. The speed of growth is much higher compared with the high pressure method and it is possible to form diamond as fine crystals on the treated substrate.

Contrary to the above, the present inventors have developed a method for chemical vapor deposition (CVD) of a diamond film using the plasma jet chemical vapor growth apparatus shown in FIG. 1, as mentioned above. However, to cause the growth of the diamond film by plasma jet CVD, a carbon source such as $CH_4$ or other hydrocarbon must be heated rapidly to a high temperature in the arc discharge region where it is decomposed so as to be ejected as a plasma jet which strikes the metal plate 1 to lose energy whereupon the carbon crystallizes as diamond. Not all of the carbon (C) from the hydrocarbon turns into diamond at this time. Rather, a considerable amount thereof precipitates as amorphous carbon or graphite on the metal plate 1, but when hydrogen gas ($H_2$) is mixed with the hydrocarbon in the starting gas 8, the amorphous carbon or graphite nondiamond components are reduced to $CH_4$, $C_2H_6$ or other hydrocarbons which are removed as gases.

Actually, however, the removal action of the $H_2$ gas is not complete and such nondiamond components are detected in most diamonds film formed by the plasma jet CVD method. This has been a factor in reducing the hardness of diamond films.

As mentioned earlier, diamond has a high hardness of 10,000 kg/mm$^2$, so it has been recognized as a potential coating material for various tools, but the diamond film obtained by the plasma jet CVD method contains amorphous carbon or graphite, resulting in insufficient hardness.

Furthermore, in the past, diamond has been used in connection with high performance tools which utilize its hardness and as heat sinks for devices which generate large amounts of heat such as semiconductor lasers since it has a high heat conductivity of as much as several times that of copper.

However, when a diamond film is formed by CVD, since the material serving as the substrate is a material (a carburizing material such as, for example, Ni, Co, and Fe) through which carbon may permeate, the carbon component has been dispersed in the substrate making synthesis of a diamond film impossible. Therefore, when using a diamond film for a tool or heat sink in the prior art, it has been limited to base materials (an arm in the case of a tool and a subcarrier in the case of a heat sink) other than carburizing materials. However, it would be very convenient if it was possible to form a hard film like diamond on a soft material like a carburizing material.

SUMMARY OF THE INVENTION

Accordingly, the objects of the present invention are to eliminate the above-mentioned disadvantages of the prior art and to provide a method and apparatus for vapor deposition of diamond film on an object to be treated and having superior adhesiveness with the treated object.

Another object of the present invention is to provide a diamond film suitable for a heat sink having superior adhesiveness with a bonding metal without impairing the heat conductivity of the diamond.

A further object of the present invention is to provide a method for forming a flat and plain diamond film on a substrate.

A still further object of the present invention is to provide a method for forming a diamond film having a high hardness on a substrate.

A still further object of the present invention is to form a diamond film on a substrate made of carburizing material.

Other objects and advantages of the present invention will be apparent from the following description.

In accordance with the present invention, there is provided a method for producing a diamond film on a surface of a substrate by chemical vapor deposition, said substrate comprising a main component. The method comprises forming a first layer over said substrate surface, said first layer comprising a mixture of said main component and a sintering reinforcement agent for diamond; forming a second layer over said first layer, said second layer comprising a mixture of said reinforcement agent and diamond; and forming a diamond film over the second layer. In accordance with the invention, the layers and the film are all formed in the same apparatus.

In accordance with the present invention, a diamond film is provided. The film comprises (i) a diamond film formed on a metal plate by chemical vapor deposition method and (ii) a mixed phase composed of components formed from a metal capable of bonding with the diamond film and which are included in the surface, bottom, or entirety of the diamond film.

In accordance with the present invention, there is further provided a method of forming a diamond coating on a substrate comprising synthesizing a diamond film on the substrate by the CVD method using a gas of a diamond forming material and a gas of a diamond nuclei formation promoter.

In accordance with the present invention, there is still further provided a method for synthesis of a diamond film comprising evacuating a reaction chamber; feeding a starting gas containing hydrogen and a hydrocarbon gas between an anode and a cathode in said evacuated reaction chamber; causing generation of a plasma jet by arc discharge between said anode and said cathode; feeding a powder of tungsten, molybdenum, silicon or titanium into said plasma jet; and causing said plasma jet to impinge on a substrate surface to thereby form a diamond film containing hard carbides on said surface.

In accordance with the present invention, there is still further provided a method for synthesizing a diamond film comprising the steps of forming a protective film of a carburizing material on a substrate by plasma injection using a component capable of forming a carbide having a high melting point; and forming a diamond film over the protective film using plasma chemical vapor deposition.

In accordance with the present invention, there is still further provided an apparatus for effecting the formation of a diamond film on an object to be treated or on a substrate. The apparatus comprises:

an electrode forming member having a first polarity comprising an enclosed body having a nozzle opening therein for jetting thermal plasma and a discharge gas feed pipe;

an electrode forming member having an opposite polarity and positioned in opposed relationship to said nozzle opening of said enclosed body;

a direct current plasma torch having a power source supply system containing a direct current source for applying a direct current voltage between said electrode of first polarity and said electrode of opposite polarity and which includes means for feeding a gas through said discharge gas feed pipe between the electrodes to which the direct current voltage is applied, forming said gas into a thermal plasma by the direct current arc discharge between the electrodes and jetting the thermal plasma formed as a plasma jet through said nozzle;

a starting gas feeding system for feeding gaseous starting compounds for vapor phase deposition to said plasma torch;

a powder supply pipe for feeding a metal powder to said arc discharge; and a substrate supporting mechanism for supporting the substrate in a non-equilibrium plasma and permitting a thermal plasma chemical vapor deposition film to be deposited in a vapor phase on said substrate.

In accordance with the present invention, there is still further provided a method of producing a diamond film on an object to be treated on a substrate by a chemical vapor deposition method wherein a first layer is formed by feeding a powder comprising a mixture of a main component of the object and a sintering reinforcement agent into a plasma jet generated by direct current arc discharge, a second layer is formed by feeding a powder comprising said agent into a plasma jet, a diamond film is formed by feeding a starting gas containing hydrogen and a carbon source between an anode and a cathode of a thermal plasma chemical vapor deposition apparatus to generate a plasma jet including a radicalized carbon compound, and a surface of the object is inclined at an angle of 30 to 60 degrees from the flow direction of the plasma jet and rotated whereby the diamond film is deposited firmly on side faces of the surface.

BRIEF DESCRIPTION OF THE DRAWINGS

The present invention will be better understood from the description set forth below with reference to the accompanying drawings, in which.

DESCRIPTION OF THE PREFERRED EMBODIMENTS

Figure 1:
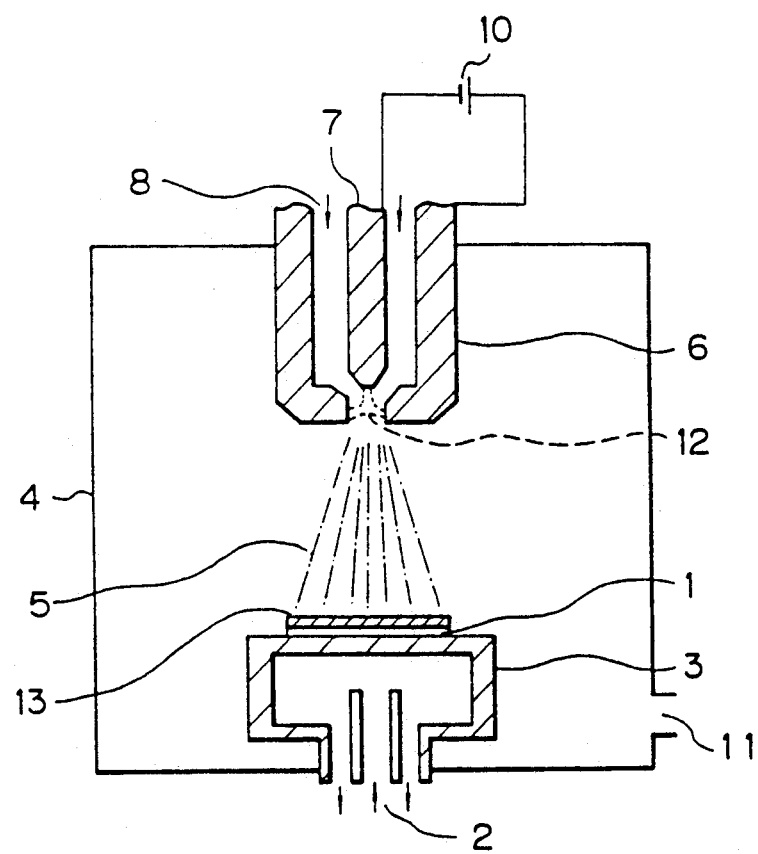
FIG. 1 is a schematic view which illustrates the principles of a known apparatus for use in the formation of a diamond film on a substrate.

According to a first embodiment of the present invention, a method is provided for raising the adhesiveness between a treated object and a diamond film using a CVD apparatus for forming the diamond film and two or more intermediate layers on the treated object, i.e., the resultant article comprises a first intermediate layer/second intermediate layer/diamond film or a first intermediate layer/second intermediate layer/third intermediate layer/diamond film.

The operation of the present apparatus will now be briefly explained.

An object (for example, a tool) to be treated or substrate is placed on a substrate holder 3 cooled by cooling water 2. At the top of the reaction chamber 4 is an anode 6 and a cathode 7 for forming a plasma jet 5. A starting gas 8 is supplied between the anode and the cathode. To enable formation of a metal layer, a powder feed pipe 9 opens at the tip of the anode 6. A DC power source 10 is provided connecting the anode 6 and the cathode 7. At the bottom of the reaction chamber 4 is an exhaust outlet 11. For CVD growth of diamond, a mixed gas of hydrogen ($H_2$) and a hydrocarbon, for example, methane ($CH_4$) is supplied between the anode 6 and cathode 7 and directed into the inside of the reaction chamber 4. The exhaust system is operated for exhausting chamber 4 via exhaust outlet 11 and thus the inside of the reaction chamber 4 is held at a low vacuum, in which state an arc discharge 12 is caused between the anode 6 and cathode 7, the heat of which causes decomposition and plasmatization of the starting gas 8, whereupon the plasma jet 5 including carbon plasma strikes the metal plate 1 and a diamond film 13 composed of fine crystals is grown on the metal plate 1. According to the present invention, to grow a mixed film of metal and diamond, a metal powder is supplied through the powder feed pipe 9 into the arc discharge 12, and to grow just a metal film, $H_2$ is used as the starting gas 8 and metal powder or inorganic material powder (e.g., silicon) is supplied through the powder feed pipe 9 into the arc discharge 12.

Figure 4:
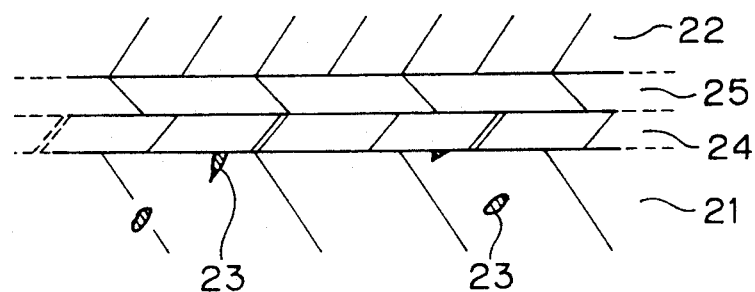
FIG. 4 is a sectional view for explaining the present invention.

FIG. 4 is a sectional view for explaining the present invention. In FIG. 4, the treated object 21 is a sintered body comprising WC or Mo$_2$C, in which sintered body is dispersed a sintering reinforcement 23 such as cobalt (Co). In accordance with the present invention, first intermediate layer 24 is composed of a mixture comprising, for example, 90 to 99.9 wt % of the main component material of the treated object 1, i.e, WC or MoC, and 0.1 to 10 wt % of the component elements of a diamond sintering reinforcement agent, i.e., cobalt (Co), iron (Fe), nickel (Ni), or some other transition metal. The second intermediate layer 25 is composed of a mixture comprising, for example, 0.1 to 10 wt % of the component elements of the diamond sintering reinforcement agent, i.e., cobalt (Co), iron (Fe), nickel (Ni), or other transition metal and 90 to 99.9 wt % diamond. The diamond film 22 is grown on the second intermediate layer 25.

Furthermore, according to the preferred embodiment of the present invention, three intermediate layers are included. The layers include a first intermediate layer composed, for example, of 90 to 99.9 wt % of a component element of the object and 0.1 to 10 wt % of a component element of a sintering reinforcement agent for diamond, a second intermediate layer composed of a mixture of the object component, the sintering reinforcement agent and diamond, wherein the mixture includes, for example, 0.1 to 10 wt % of the sintering reinforcement agent and 90 to 99.9 wt % of the other two ingredients, and wherein the ratio of the object component to diamond ranges from 1:9 to 9:1, and a third intermediate layer composed, for example, of 0.1 to 10 wt % of a component element of the sintering reinforcement agent and 90 to 99.9 wt % diamond.

The present invention, by providing at least two intermediate layers in this way, and gradually changing the composition of the layers, provides an article having a diamond film 22 which is free from peeling even when formed to a thickness of about 100 μm.

Although there are no critical limitations relative to the thickness of the intermediate layers and of the diamond film, the preferable thickness of each intermediate layer is 2 to 10 μm and more preferably 4 to 8 μm, and the preferable thickness of the diamond film is 10 to 100 μm and more preferably 20 to 40 μm. Furthermore, the size of the powder is preferably 0.1 to 8 μm, more preferably 0.4 to 1 μm.

According to a second embodiment of the present invention, the surface, bottom, or entirety of a diamond film formed by a plasma jet chemical vapor deposition method includes a mixed phase comprised of component metallic elements capable of bonding with said diamond film.

The present invention uses the above-mentioned CVD apparatus to form a mixed phase of diamond and a bonding metal element at the surface or bottom of the diamond film or throughout the entirety thereof.

Figure 2A:
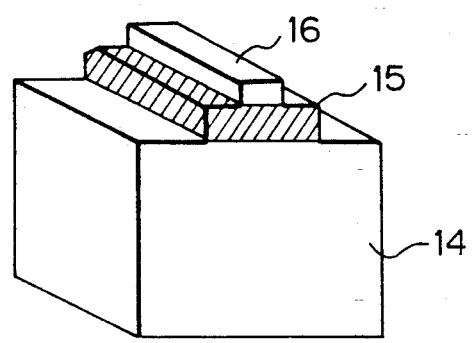
FIG. 2A is a perspective view of a cooling structure of the prior art.
Figure 2B:
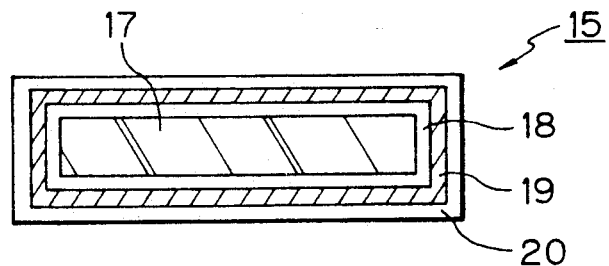
FIG. 2B is a sectional view of a heat sink of the prior art.
Figure 5:
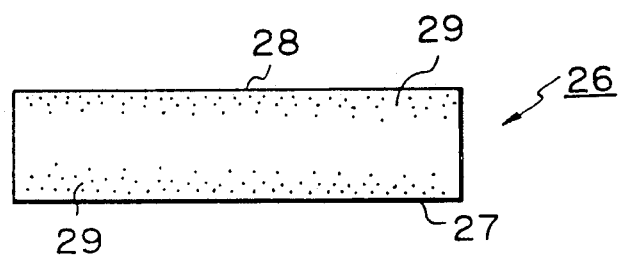
FIG. 5 is a sectional view of a heat sink using the present invention.

FIG. 5 is a sectional structural view of a diamond film for use as a heat sink of a semiconductor device, wherein a mixed phase 29 of diamond and Cu is formed at the bottom surface and the top surface of the diamond film 26. The film 26 may be used in place of the film 15 of FIG. 2A, for example, with the surface 27 in contact with the subcarrier 14 made of Cu and with the surface 28 contacting the semiconductor chip 16.

Further, for mechanical applications utilizing the hardness of diamond, it is possible to form the mixed phase only at the bottom surface which bonds with the object or to form the entire film as a mixed phase.

The foregoing is made possible because, while the diamond film formed by a CVD method is generally polycrystalline and therefore shearing occurs easily at the crystalline interface and the crystal is relatively brittle, since metal is interposed in the mixed phase, the mechanical strength is superior.

That is, when the diamond film is used as a heat conductor, the mixed phase may be just the bonded portion. Alternatively, for applications where hardness is desired, the entire film may be formed of the mixed phase to eliminate shearing.

According to a third embodiment of the present invention, a flat or plain diamond film is formed on a substrate by the CVD method using a starting gas (e.g., H$_2$, methane) for forming the diamond and a gas of an element for promoting formation of diamond nuclei such as a reducing metal (e.g., Pt), a carburizing metal (e.g., Ni, Co, Fe), or a metal or semiconductor capable of easily forming a carbide (e.g., W, Si, Mo, Ti).

In the present invention, a diamond coating is formed by simultaneously or alternatingly spraying the above-mentioned diamond forming starting gas and diamond nucleus promoting element gas onto the substrate by the CVD method or by constantly spraying the starting gas and intermittently spraying the nucleus promoting element gas. That is, in accordance with the present invention, in the synthesis of diamond by a vapor phase synthesis method, an element for promoting the formation of diamond nuclei is sprayed so as to generate large quantities of high density nuclei at the same time a the synthesis of the diamond film. The growth of specific crystal particles is thus suppressed to provide a smooth or plain diamond film. Thus, the present invention forms diamond coatings using the foregoing materials by CVD.

According to a fourth embodiment of the present invention, a diamond film having a desired high hardness can be formed on a substrate by evacuating a reaction chamber using an exhaust system, and at the same time supplying a mixture of a hydrocarbon gas and hydrogen gas between an anode and cathode provided in the reaction chamber. A plasma jet of carbon is thus generated by arc discharge and a diamond film is formed on the substrate. While the film is being formed, a powder of an element capable of bonding with non-diamond carbon components in said plasma jet to form hard carbides, e.g., tungsten (W), molybdenum (Mo), silicon (Si) or titanium (Ti) is added to the plasma jet.

Figure 3:
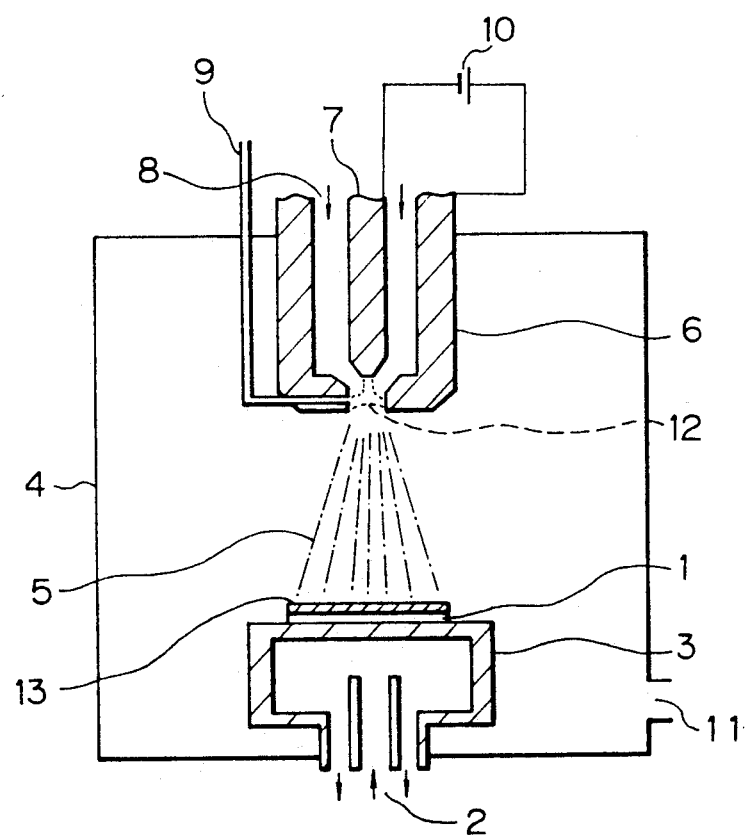
FIG. 3 is a schematic view which illustrates the principles of the present invention for use in the formation of a diamond film on an object or substrate.

The present invention uses a plasma jet CVD apparatus as shown in FIG. 3 to form a diamond film. As the diamond film forms, a powder of a material capable of forming hard carbides, e.g., W, Mo, Si or Ti is added through powder feed pipe 9 and reacted with amorphous carbon, graphite, and other nondiamond components to form hard carbides such as tungsten carbide (WC, hardness of 2200 kg/mm$^2$), molybdenum carbide (Mo$_2$C, hardness of 1800 kg/mm$^2$), silicon carbide (SiC, hardness of 2300 kg/mm$^2$), titanium carbide (TiC, hardness of 300 kg/mm$^2$), and the like.

That is to say, amorphous carbon and graphite components are more active energy wise than diamond, and so such components selectively bond with radicals of metal elements in the plasma state to form hard carbides. Thus, the present invention provides for the growth of diamond film by a plasma jet CVD method using a gaseous mixture of a hydrocarbon such as $CH_4$ and $H_2$ as a starting material gas, and at the same time changing the small amounts of nondiamond components existing in the diamond polycrystalline layer as a result of insufficient reduction and removal by the $H_2$ gas into hard carbides to thus improve hardness.

According to a fifth embodiment of the present invention, a diamond film is formed on a substrate of a carburizing material. A protective film is first formed on the substrate of carburizing material by plasma injection using an element which readily forms a carbide with a high melting point. A diamond film is then formed over the protective film by plasma CVD.

That is, the present invention enables the coating of a diamond film on a carburizing base material by a vapor phase synthesis method by first providing a coating film facilitating the synthesis of diamond on the surface of the base material.

Examples of carburizing materials usable in the present invention, are Fe, Ni, Co, and other metals. Further, as elements which readily form a carbide with a high melting point, use is preferably made of WC, Si, Mo, W, or other such elements. It is possible to use these materials and to perform the method of the present invention using the same apparatus, as is clear from the examples set forth below.

When forming a protective film in accordance with the method of the present invention, hydrogen, argon, helium, or other inert gas is introduced into the apparatus and is converted to plasma by DC arc discharge. An element which readily forms a carbide with a high melting point is introduced through another pipe and is melted by the high temperature generated in the plasma to thus form a protective film over the substrate.

Figure 10:
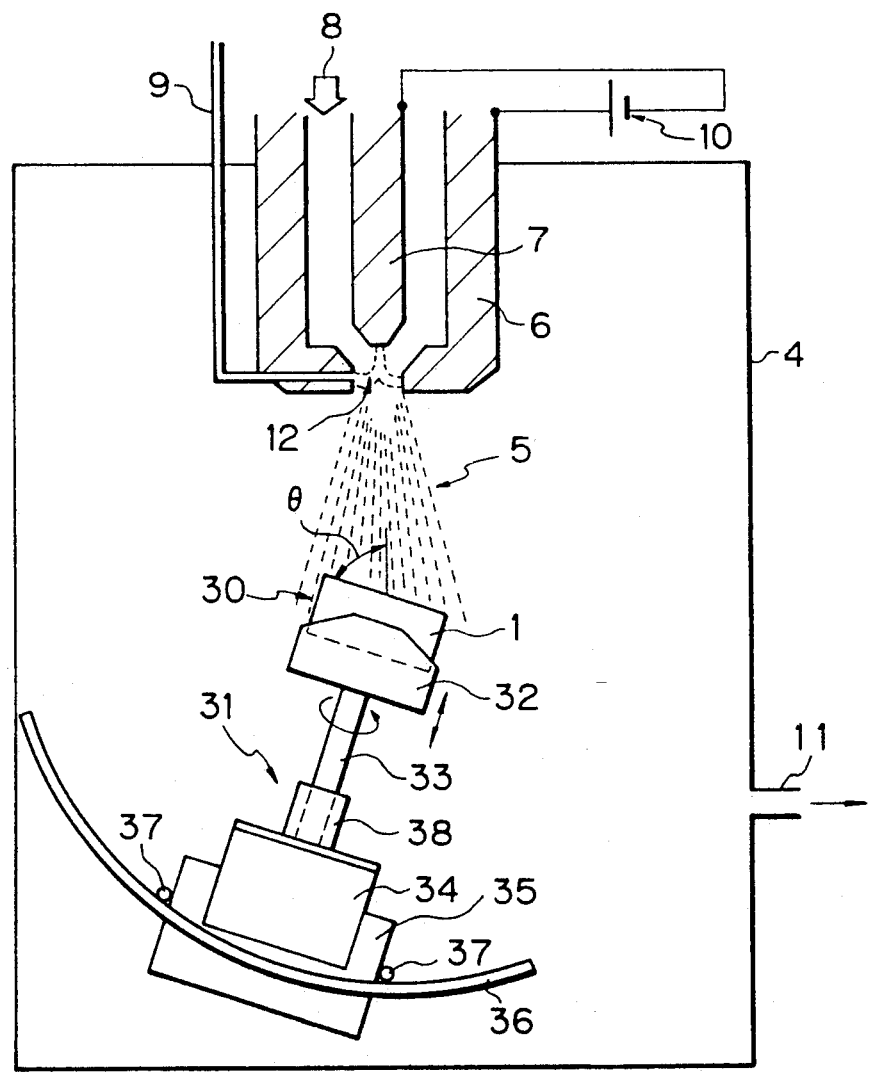
FIG. 10 is a schematic view of an apparatus for coating a diamond film according to the present invention.
Figure 11:
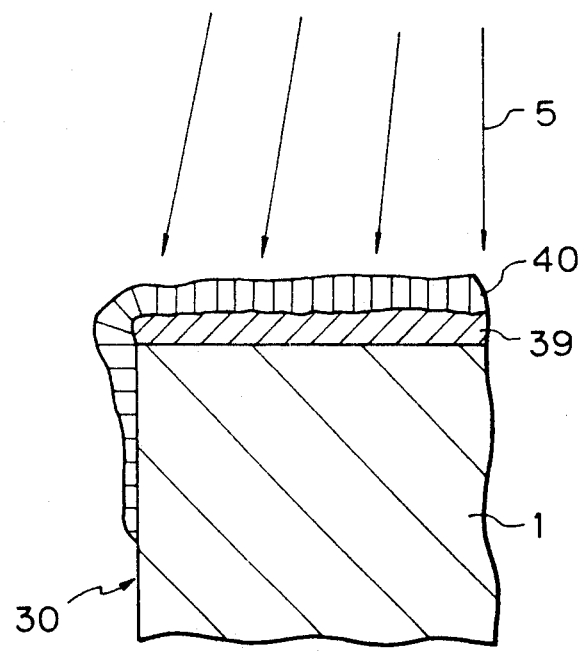
FIG. 11 is a cross-sectional view of an end portion of a substrate coated according to a prior art method.
Figure 12:
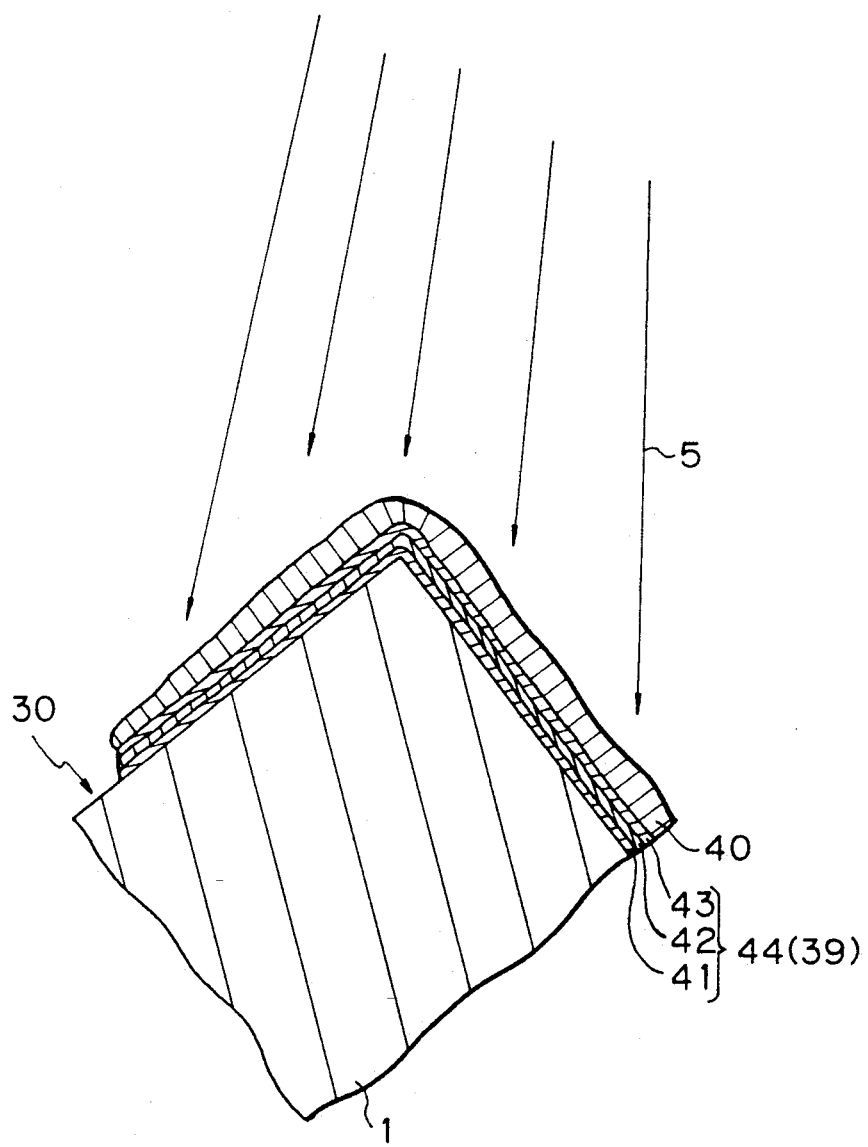
FIG. 12 is a cross-sectional view of the end portion of a substrate coated according to the present invention.

According to a sixth embodiment of the present invention, a diamond film is uniformly and firmly deposited even on the side surfaces of an object or substrate as shown in FIGS. 10 to 12.

That is, when the above-mentioned intermediate layers and diamond films are formed on an object (or substrate) 1, the desired layers and diamond film are not deposited on the side faces 30 of the object because the plasma jet 5 does not sufficiently impinge on such side surfaces 30. However, according to this embodiment, during the formation of the intermediate layers and the diamond film, the object 1 is inclined from the flow direction line of the plasma jet 5 by 30 to 60 degrees (See $\theta$ in FIG. 10), and the object is rotated, whereby the intermediate layers and the diamond film are uniformly and firmly deposited on the side faces 30 of the object 1.

According to the first embodiment of the present invention, for example, if the intermediate layer 39 and the diamond film 40 are to be deposited on the side surfaces 30 of the object 1, the side surfaces 30 are not well covered by the intermediate layer 39 because the plasma jet 5 does not impinge on the side surfaces 30. Accordingly, the diamond film 40 may sometimes be deposited directly on the side surfaces 39 as shown in FIG. 11. Thus, the diamond film 40 on the side surfaces 30 tends to be easily peeled off, or cracks may sometimes occur between the intermediate layer 30 and the diamond film 40, especially at the end portions of the object 1.

Contrary to the above, since the object 1 is rotated at an angle $\theta$ relative to the flow direction of the plasma jet 5 according to this embodiment, the side faces 30 of the object 1 can be uniformly and firmly covered with the intermediate layers 44 (39) and the diamond film 40, as shown in FIG. 12. In FIG. 12, a first intermediate layer 41 having a thickness of, for example, 2-5 $\mu$m is formed by introducing a powder of, for example, WC (the same material as the object), into a plasma jet 5 formed from hydrogen gas or an inert gas. A second intermediate layer 42 having a thickness of, for example, 10-20 $\mu$m is then formed by introducing a powder of WC and a powder of, for example, Fe, Co, Ni, Nb and/or Ta, into a plasma jet 5 generated from hydrogen gas and a carbon source. A third intermediate layer 43 having a thickness of, for example, 20-30 $\mu$m is formed by introducing a powder of, for example, Fe, Co, Ni, Nb and/or Ta (the same metal used in the formation of the second intermediate layer 42) into a plasma jet 5 generated from hydrogen gas and a carbon source (e.g., a hydrocarbon gas such as methane). Thereafter, a diamond film 40 having a thickness of, for example, 30-50 $\mu$m is formed in the same manner as mentioned above.

The inclination and rotation of the object (or substrate) 1 can be effected in any conventional manner. For example, as shown in FIG. 10, the supporting means 31 for the object (or substrate) 1 is composed of a cooled support 32 for the object 1, a motor 34 provided with a rotating shaft 33 for rotating the support 32, a movable base 35 for carrying the motor 34, and an arc-shaped guide member 36 for moving the movable base 35 so that the surface of object 1 to be coated is inclined at an angle $\theta$. Although, in the above embodiment, the object 1 is moved s that it is inclined from the plasma jet flow direction, the plasma torch could also be moved in a similar manner.

EXAMPLES

The present invention will now be explained, in detail, by reference to but without limitation by the following Examples.

EXAMPLE 1

As the treated object 1, a sintered body using Co as a sintering reinforcement and having a composition of WC-10% Co was used. As the component materials for the first intermediate layer 24, WC and Co were used. Further, as the component materials for the second intermediate layer 25, diamond and Co were used. As the conditions for growth of the second intermediate layer and of the diamond film, the CVD apparatus shown in FIG. 3 was used and $H_2$ gas at 10 to 50 liter/min and $CH_4$ gas at 0.05 to 1 liter/min were supplied to the apparatus. Further, an arc current of 10 to 70 A and an arc voltage variable in a range of 50 to 150 V were used. The vacuum of the reaction chamber was held in the range of 1 to 10 kPa.

When growing the first intermediate layer on the treated object, $H_2$ gas was supplied as the starting gas and a plasma get was generated, in which state WC and Co particles having a particle size of 1 to 5 $\mu$m were supplied from the powder feed pipe 9 at a rate of 0.01 to 0.1 cc/h and plasmatized so as to grow as a deposited mixture to a thickness of 20 $\mu$m.

The material gas was changed to a mixed gas of $H_2$ and $CH_4$ and a Co powder having a particle size of 1 to 5 $\mu$m was supplied from the powder feed pipe 9 to create a plasma jet and form a second intermediate layer comprised of a mixture of diamond and Co which was deposited to a thickness of 30 $\mu$m.

Figure 6:
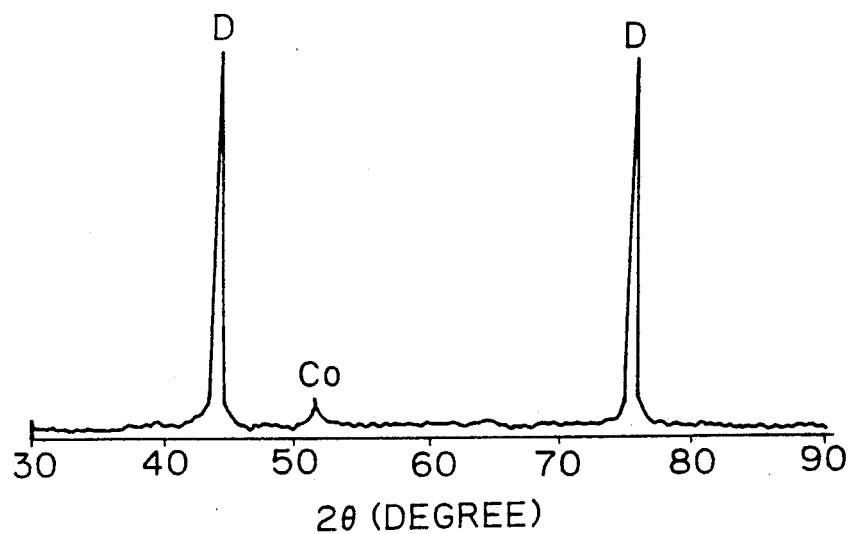
FIG. 6 is a diagram illustrating an X-ray diffraction pattern of a second intermediate layer.

FIG. 6 is an X-ray diffraction pattern of the second intermediate layer, where the diffraction lines of diamond (abbreviated as D) and Co clearly appear, so it is understood that a mixed layer was grown. Then, a plasma jet was created using a mixed gas of $H_2$ and $CH_4$ as a material gas and a diamond film having a thickness of about 100 μm was formed on top of the second intermediate layer top. The adhesion between the treated object and the diamond film formed in this way is strong. A tensile test gave a value of more than 600 kg/mm$^2$.

EXAMPLE 2

The CVD apparatus shown in FIG. 3 was used and a starting gas 8 composed of hydrogen ($H_2$) gas at a variable flow rate of from 10 to 50 liter/min and methane gas ($CH_4$) at a variable flow rate of from 0.05 to 1 liter/min was supplied. Further, metallic powder comprised of Cu powder with a particle size of 1 to 5 μm was supplied through powder feed pipe 9 at a variable rate of from 0.01 to 0.1 cc/h.

When use is made of a mixture of $CH_4$ and $H_2$ as the starting gas 8, a diamond film 13 is formed, and when metal particles are mixed in, a mixed phase of diamond and metal is formed. Further, when $H_2$ gas and a metal powder are used, a metal film is formed. The conditions for causing CVD growth are a vacuum in the reaction chamber 4 of 1 to 10 kPa, an arc current of 10 to 70 A, and an arc voltage of 50 to 150 V. Thus, a diamond film having a thickness of 50 μm was formed so as to include a mixed phase containing Cu and having a thickness of 1 μm with a ratio of composition of the top surface and bottom surface of about 5:1. Then, using this diamond film as a heat sink and using solder with a melting point of 250° C. to bond the film to a subcarrier and to a laser diode on top of it, it was possible to obtain a sufficient bonding strength.

EXAMPLE 3

In an apparatus as shown in FIG. 3, hydrogen gas, methane gas, or other starting gas 8 is introduced from the top of the plasma torch in the reaction chamber and is made into plasma by DC arc discharge. The plasma 5 reacts on the substrate 1 to form a diamond film 13. In the process of synthesis, metal particulates may be introduced along with the material gas and metal vapor sprayed on the diamond surface. In the working of the present invention, 10 to 50 liter/min of hydrogen gas, 0.05 to 1 liter/min of methane gas, and a substrate of WC having a thickness of 0.5 mm and a surface area of 10×10 mm$^2$ were used. As the spraying powder material, 0.001 to 0.0001 cc of 1 to 5 μm particulates of W are supplied each time the thickness of the diamond film increases 0.1 mm. The arc current is 10 to 70 A and the arc discharge is 50 to 150 V. Further, the degree of vacuum in the reaction chamber is 1 to 10 kPa. As a result, even with a diamond film having a thickness of 2 mm, the surface roughness is less than 0.05 mm.

Diamond films were synthesized under the same synthesis conditions but with different types of metal particulates and the surface roughness were measured. The results are shown in Table 1.

TABLE 1

|  | Pt | W | Mo |
| --- | --- | --- | --- |
| Particle size (μm) | 1-2 | 0.45-1.0 | 0.7-1.0 |
| Arc discharge (A) | 10-40 | 30-70 | 30-70 |
| Diamond film | 0.3 mm | 0.05 mm | 0.05 mm |

TABLE 1-continued

|  | Pt | W | Mo |
| --- | --- | --- | --- |
| roughness | or less | or less | or less |

EXAMPLE 4

The CVD apparatus shown in FIG. 3 was used and a super hard alloy of W including 8% Co was utilized as the metal plate 1. As the conditions for the supply of starting gas 8, the flow of hydrogen ($H_2$) gas was varied within the range of 10 to 50 liter/min and the flow of methane ($CH_4$) gas was varied within the range of 0.05 to 1 liter/min and, as a metal powder, a powder of W having a particle size of 1 to 5 μm was supplied at a rate of 0.01 to 0.1 cc/h. Then, the conditions where CVD was possible included a vacuum in the reaction chamber 4 of 1 kPa to 10 kPa, an arc current of 10 to 70 A, and an arc voltage of 50 to 150 V.

Figure 7:
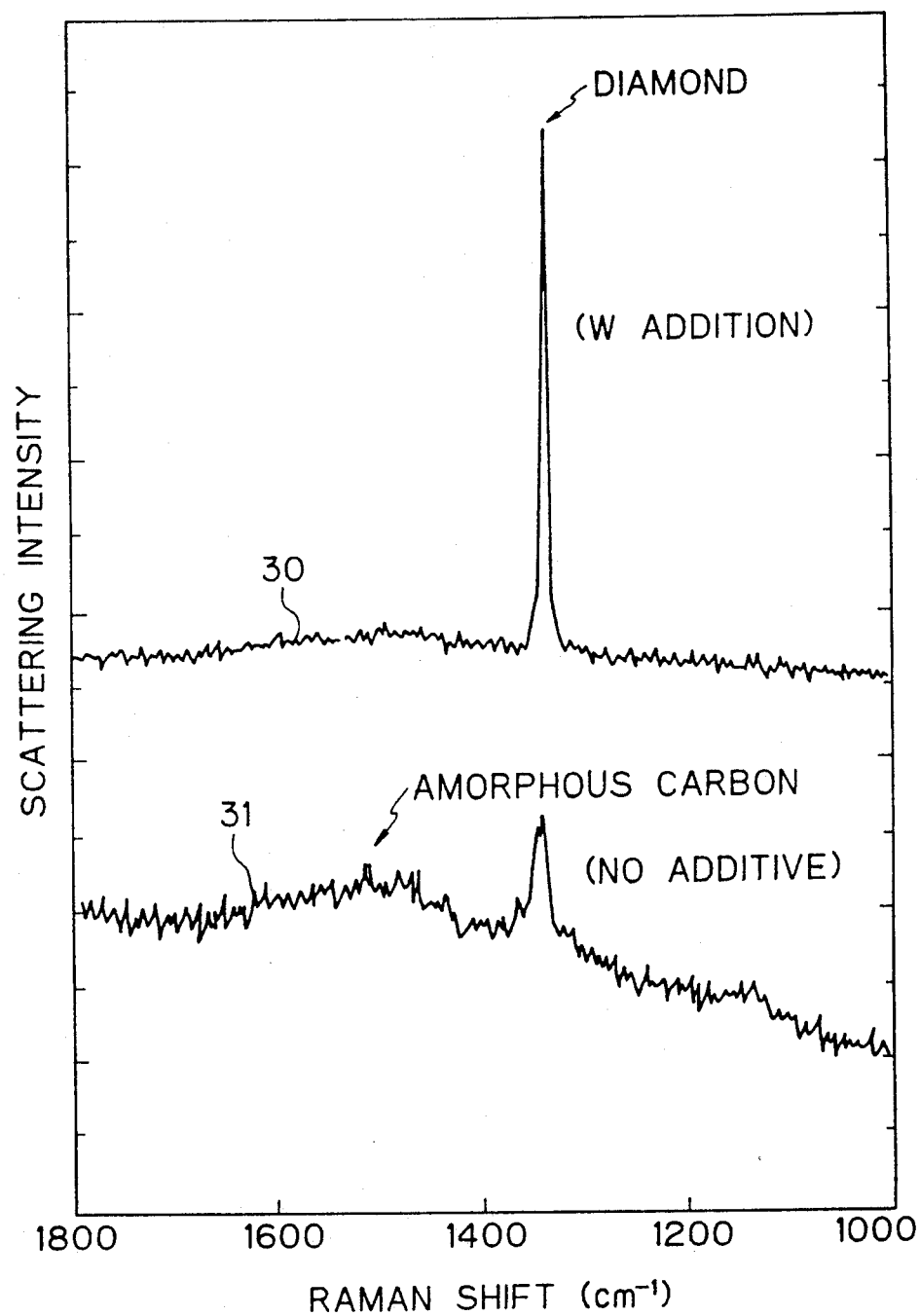
FIG. 7 is a diagram illustrating the Raman spectrum of Example 4.

FIG. 7 compares the Raman spectrum 30 of a film obtained by supplying W as an additive with the Raman spectrum 31 of a film with no additive. As will be understood from FIG. 7, a broad peak amorphous carbon was observed near 1500 cm$^{-1}$ in the spectrum 31 of the film with no additive.

On the other hand, a sharp peak of diamond was observed at 1333 cm$^{-1}$ in the spectrum 30 of the film obtained by supplying W, and the peak of the amorphous carbon near 1500 cm$^{-1}$ was extremely low.

It was confirmed from the Raman scattering that the diamond film synthesized in this way had an extremely small content of nondiamond components.

Further, the hardness of the diamond film formed in this way is about 10,000 kg/mm$^2$, a hardness which is close to that of natural diamond.

It is to be noted that when a Mo, Si, or Ti metal powder is supplied from the powder feed pipe 9 to form a carbide, the conditions for formation of the diamond film are the same and it is possible to obtain a diamond film having a hardness that is similar to the hardness obtained in a case where WC is formed.

In an apparatus as shown in FIG. 3, use was made of a substrate 1 of Ni having a thickness of 0.5 mm and an inert gas (or hydrogen) was introduced into the plasma torch in the reaction chamber 4 at a flow rate of 10 to 50 liter/min. Then, using an arc current of 10 to 70 A and an arc voltage of 50 to 150 V, the inert gas was subjected to arc discharge and converted to plasma. The vacuum in the reaction chamber was 1 to 10 kPa.

As this plasmatization of the inert gas occurred, WC particulates of 1 to 5 lm were supplied from a powder feed apparatus at a rate of 0.01 to 0.1 cc/h. The WC particulates were melted by the high temperature plasma and together with the plasma jet 5 were deposited on the substrate 1 to form a protective film.

Figure 8:
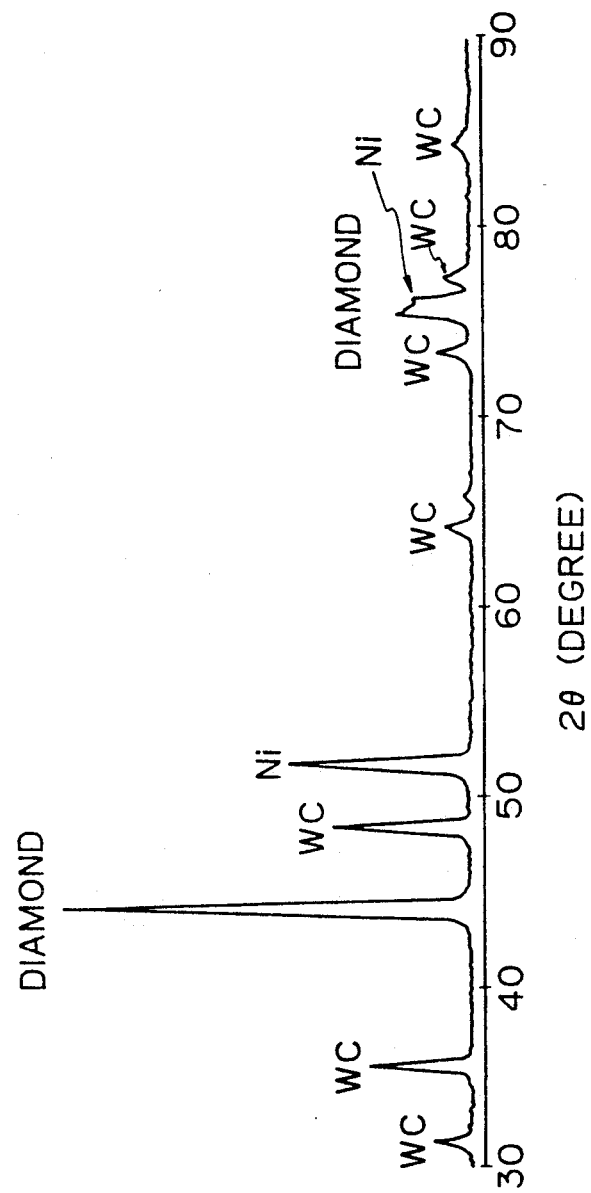
FIG. 8 is a diagram illustrating an X-ray diffraction pattern in the case of a substrate having a protective film of the present invention.

Then, the supply of powder from the powder feed pipe 9 was stopped and a starting gas for forming diamond (methane and hydrogen) was introduced into the reaction chamber 4. The feeding flow rates of the methane gas and hydrogen gas were respectively 0.05 to 1 liter/min and 10 liter/min to 100 liter/min. The starting gas was converted to plasma by the DC arc discharge 12 at the same time and the plasma jet 5 was directed onto the protective film to form the diamond film 13. The diamond film obtained by the method of the present invention was subjected to X-ray analysis and the resultant pattern is shown in FIG. 8. The pattern includes a pattern of a protective film and a pattern of diamond and it can be seen that a diamond film was definitely synthesized.

Figure 9:
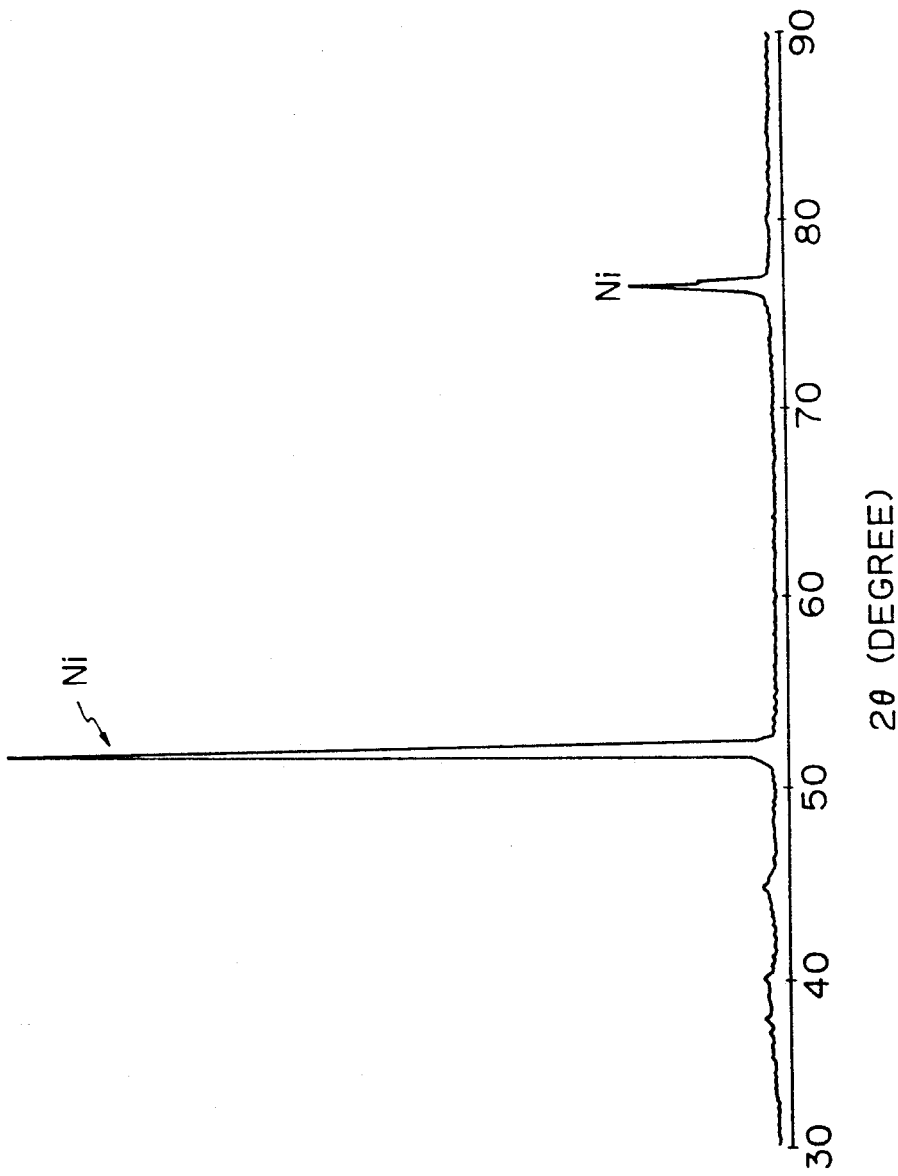
FIG. 9 a is diagram illustrating an X-ray diffraction pattern in the case of a substrate not having a protective film.

On the other hand, X-ray analysis was performed on a substrate where synthesis of diamond was attempted without a protective film and the resultant pattern is shown in FIG. 9. As is clear from FIG. 9, only the pattern of the Ni substrate is observed and there is no diamond pattern. Thus, it was confirmed that no diamond film was synthesized.

According to the present invention, a diamond film having superior adhesiveness can be coated on a treated object, so it is possible to provide a highly reliable diamond tool.

According to the present invention, by using a CVD apparatus which can form a mixed phase of a diamond film and metal by CVD growth and by changing the combination of the type of starting gas and metal powder, the present invention may be employed to synthesize a diamond film wherein the surface, bottom, or entirety of the diamond film includes a mixed phase and it is therefore possible to obtain a diamond film having superior adhesiveness at a low cost.

Furthermore, the method of the present invention, as explained above, uses a gas of a predetermined material to form a diamond film by the CVD method, so that is possible to considerably improve the smoothness of the surface of thickness diamond films, reduce working costs, and increase work efficiency.

According to the present invention, a diamond film having reduced contamination by amorphous carbon, graphite, or other nondiamond components may be readily synthesized, and by working the invention it is possible to provide diamond tools at low cost.

As explained above, the present invention provides for the formation of a protective film of a predetermined material on a substrate and the subsequent synthesis of a diamond film on the protective film a procedure which enables coating of a diamond film on a carburizing base material, which was previously impossible.

We claim:

1. A method for synthesis of a diamond film comprising:
   evacuating a reaction chamber;
   feeding a starting gas containing hydrogen and a hydrocarbon gas between an anode and a cathode in said evacuated reaction chamber;
   causing generation of a plasma jet by arc discharge between said anode and said cathode;
   feeding a powder of tungsten, molybdenum, silicon or titanium into said plasma jet; and
   causing said plasma jet with the powder therein to impinge on a substrate surface to thereby form said diamond film containing refractory metal carbides on said surface.

2. A method for producing a diamond film on a surface of a substrate by chemical vapor deposition, said substrate comprising a main component material, said method comprising:
   (i) forming a first layer comprising a mixture of said main component material and a sintering reinforcement agent for diamond over said substrate surface by a procedure comprising:
      feeding an inert gas or hydrogen between an anode and a cathode of a thermal plasma chemical vapor deposition apparatus;
      effecting an arc discharge between said anode and said cathode while said gas is being fed therebetween, to thereby generate a plasma jet containing an inert gas or hydrogen, and feeding a powder comprising said component material and said agent into said jet; and
      causing said plasma jet with the powder therein to be directed toward said substrate surface to thereby form said first layer thereover;
   (ii) forming a second layer comprising a mixture of said reinforcement agent and diamond over said first layer by a procedure comprising:
      feeding a starting gas containing hydrogen and a carbon source between the anode and the cathode of the thermal plasma chemical vapor deposition apparatus;
      effecting an arc discharge between said anode and said cathode while said starting gas is being fed therebetween, to thereby radicalize the carbon source and generate a plasma jet containing dissociated hydrogen atoms;
      feeding, a powder comprising said agent into said jet; and
      causing said plasma jet with the powder therein to be directed toward said first layer to thereby form said second layer thereover; and
   (iii) forming said diamond film over the second layer by a procedure comprising:
      feeding a starting gas containing hydrogen and a carbon source between the anode and the cathode of the thermal plasma chemical vapor deposition apparatus;
      effecting an arc discharge between said anode and said cathode while said starting gas is being fed therebetween, to thereby radicalize the carbon source and generate a plasma jet containing dissociated hydrogen atoms; and
      causing said plasma jet to be directed toward said second layer to thereby form said diamond film thereover,
   said layers and said film all being formed in the same reaction chamber.

3. A method as set forth in claim 2, wherein an intermediate layer comprising a mixture of said main component material, said agent and diamond is formed between said first and second layers by a procedure comprising:
   feeding a starting gas containing hydrogen and a carbon source between the anode and the cathode of the thermal plasma chemical vapor deposition apparatus;
   effecting an arc discharge between said anode and said cathode while said starting gas is being fed therebetween to thereby radicalize the carbon source and generate a plasma jet containing dissociated hydrogen atoms;
   feeding a powder comprising said main component material and said agent into said jet; and
   causing said plasma jet with the powder therein to be directed toward said first layer to thereby form said intermediate layer thereover.

4. A method as set forth in claim 2, wherein said agent comprises cobalt, iron or nickel.

5. A method for forming a diamond film on a surface of a metallic object by chemical vapor deposition, said film including a mixed phase comprising diamond and a metallic material which is the same as the major component material of said object and which is capable of bonding with diamond, said method comprising:

feeding a starting gas containing hydrogen and a carbon source between an anode and a cathode of a thermal plasma chemical vapor deposition apparatus;

effecting an arc discharge between said anode and said cathode while said starting gas is being fed therebetween, to thereby radicalize the carbon source and generate a plasma jet containing dissociated hydrogen atoms;

feeding a powder comprising said metallic material into said jet; and causing said plasma jet with the powder therein to be directed toward said surface of the object to thereby form said diamond film thereon.

6. A method as set forth in claim 5, wherein said metallic object includes a substrate of a carbonizing material.

7. A method for forming a diamond coating on a substrate comprising synthesizing a diamond film on the substrate by chemical vapor deposition using a diamond forming material and a diamond nuclei formation promoter, wherein said synthesizing step comprising:

feeding a starting gas containing hydrogen and a carbon source between an anode and a cathode of a thermal plasma chemical vapor deposition apparatus;

effecting an arc discharge between said anode and said cathode while said starting gas is being fed therebetween to thereby radicalize the carbon source and generate a plasma jet containing dissociated hydrogen atoms;

feeding a powder of a diamond nuclei formation promoter into said jet; and causing said plasma jet with the powder therein to be directed toward said substrate.

8. A method as set forth in claim 7, wherein said nuclei formation promoter comprises a reducing metal, a carburizing metal or a metal capable of forming a carbide.

9. A method as set forth in claim 7, wherein said promoter comprises platinum.

10. A method as set forth in claim 7, wherein said promoter comprises nickel, cobalt or iron.

11. A method as set forth in claim 7, wherein said promoter comprises tungsten, silicon, titanium or molybdenum.

12. A method as set forth in claim 7, wherein said diamond nuclei formation promoter comprises Pt, Ni, Co, Fe, W, Si, Mo or Ti.

13. A method as set forth in claim 7, wherein said promoter comprises copper.

14. A method for producing a diamond film on a surface of a substrate by chemical vapor deposition, said substrate comprising a main component material, said method comprising:

forming a first layer comprising a mixture of said main component material and a sintering reinforcement agent for diamond over said substrate surface by feeding a powder comprising a mixture of said main component material and said agent into a plasma jet generated by direct current arc discharge;

forming a second layer comprising a mixture of said reinforcement agent and diamond over said first layer by feeding a powder comprising said agent into a plasma jet; and forming said diamond film over the second layer by feeding a starting gas containing hydrogen and a carbon source between an anode and a cathode of a thermal plasma chemical vapor deposition apparatus to generate a plasma jet including a radicalized carbon compound, said layers and said film all being formed in the case apparatus, and the substrate being inclined at an angle of 30 to 60 degrees from the flow direction of the plasma jet and rotated, whereby the diamond film is firmly deposited on side faces of the substrate.

* * * * *

UNITED STATES PATENT AND TRADEMARK OFFICE
CERTIFICATE OF CORRECTION

PATENT NO. : 5,260,106
DATED : November 9, 1993
INVENTOR(S) : MOTONOBU KAWARADA et al.

It is certified that error appears in the above-indentified patent and that said Letters Patent is hereby corrected as shown below:

Column 1, line 20, delete "a" and substitute --an--.

Column 2, line 21, delete "Jun." and substitute --June--.

Column 3, line 35, delete "." and substitute ,.

Column 8, line 34, delete "a" and substitute --as--.

Column 10, line 58, delete "get" and substitute --jet--.

Column 16, line 12, after "W" delete "." and substitute --,--.

Signed and Sealed this

Second Day of August, 1994

Attest:

BRUCE LEHMAN

Attesting Officer

Commissioner of Patents and Trademarks